United States Patent [19]
Slattery

[11] Patent Number: 4,712,126
[45] Date of Patent: Dec. 8, 1987

[54] LOW RESISTANCE TUNNEL

[75] Inventor: Francis R. Slattery, Lower Providence Township, Montgomery County, Pa.

[73] Assignee: RCA Corporation, Somerville, N.J.

[21] Appl. No.: 839,954

[22] Filed: Mar. 17, 1986

[51] Int. Cl.$^4$ .............. H01L 29/46; H01L 23/50; H01L 29/04; H01L 29/44
[52] U.S. Cl. ............................. 357/71; 357/59; 357/68
[58] Field of Search .............. 357/71 P, 71, 59 J, 357/59 G, 68

[56] References Cited
U.S. PATENT DOCUMENTS 3,964,092  6/1976  Wadham ........................ 357/68
4,072,977  2/1978  Bate et al. ..................... 357/68
4,278,989  7/1981  Baba et al. .................... 357/71 P

FOREIGN PATENT DOCUMENTS 53-91680   8/1978   Japan ........................ 357/71 P
58-103164  6/1983   Japan ........................ 357/71 P
2077491   12/1981   United Kingdom ............. 357/68

Primary Examiner—Martin H. Edlow
Assistant Examiner—Jerome Jackson, Jr.
Attorney, Agent, or Firm—Birgit E. Morris; Kenneth R. Glick; James M. Trygg

[57]  ABSTRACT

A low resistance silicon conductor for tunnelling under an intervening metal conductor on a semiconductor device is provided. The low resistance conductor includes two layers of highly doped single crystalline or polycrystalline silicon which are stacked so that one is directly over the other. A pair of metal conductors are arranged, one on each side of the intervening metal conductor. Each of the pair of metal conductors is formed in ohmic contact with a portion of each of the two layers of silicon near one of their adjacent edges, thereby forming a two layer conductive tunnel under the intervening metal conductor.

6 Claims, 10 Drawing Figures

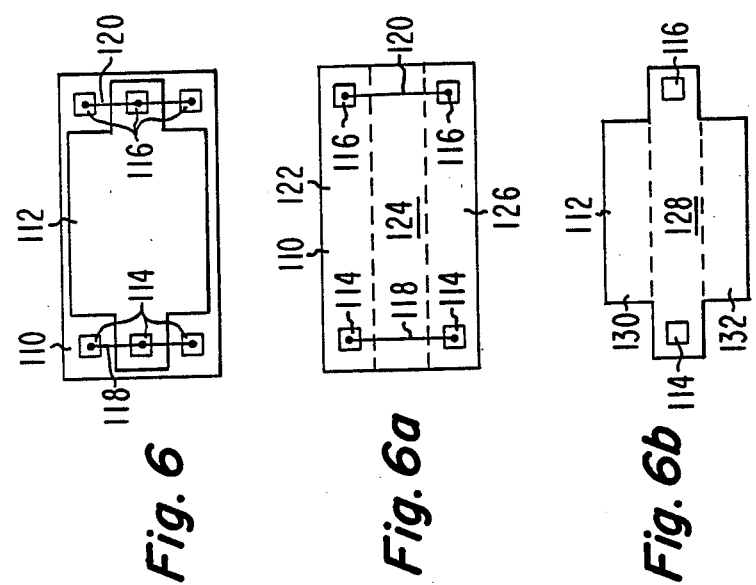
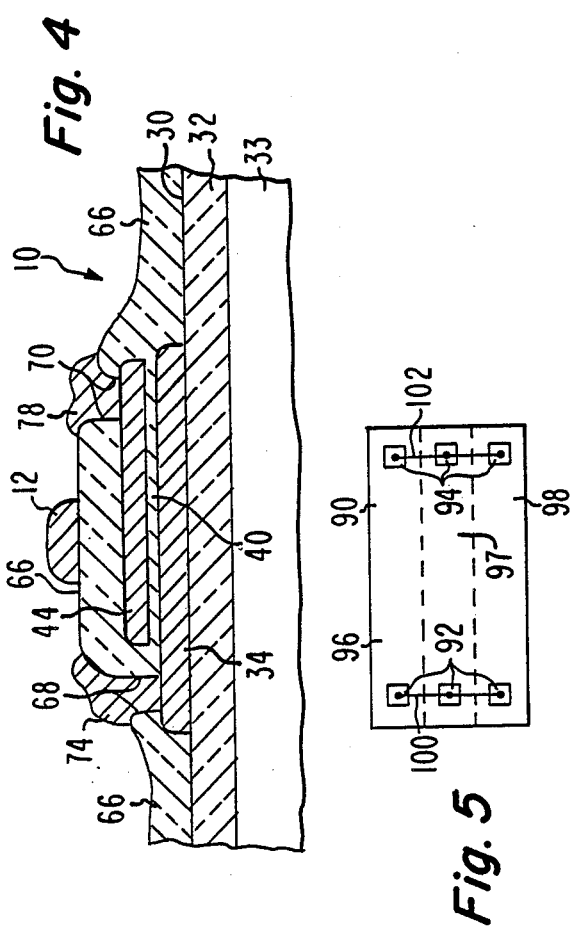
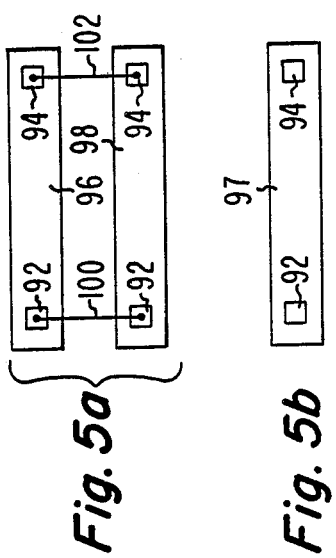

LOW RESISTANCE TUNNEL

The present invention relates to low resistance silicon conductors for tunnelling under metal conductors on a semiconductor device.

BACKGROUND OF THE INVENTION

In complex integrated circuit devices requiring extensive use of first and second level metal conductors for interconnecting various portions of the integrated circuit, it is occasionally necessary to interconnect portions on opposite sides of an intervening metal conductor. Such interconnections are typically effected by means of a layer of doped silicon which is formed as a tunnel under the intervening metal conductor and insulated therefrom. The desired interconnection is then made to the doped silicon layer on each side of the intervening metal conductor. Such a prior art structure is shown in FIG. 1 which shows a semiconductor device 8, an intervening metal conductor 12, and a layer 14 of doped polycrystalline silicon which is insulated from the conductor 12 by a layer 15. The desired interconnection is achieved by effecting ohmic contact between a metal conductor 16 and the layer 14 on one side of the conductor 12 and similarly, effecting ohmic contact between another metal conductor 18 on the other side of the conductor 12. The required ohmic contact is effected at a plurality of discrete contact points 20 in accordance with standard design rules which are commonly used throughout the industry. Typically, the contact points 20 are square or rectangular and are substantially equally spaced so that the spaces between the contacts are about equal to the length of a contact point, however, substantial variations in these relative lengths often occur. Such arrangements provide sufficient contact area so that the full current carrying capability of the layer 14 is utilized. However, it will be appreciated by those skilled in the art that the doped layer 14 of polycrystalline silicon, at best, has a sheet resistance of about 15 ohms per square resulting in an interconnection that will be unsuitable for certain applications where a low resistance conductor is needed. Heretofore, for such applications and where metal silicides are unacceptable, there has been no way of effecting a low resistance interconnection without increasing the width of the tunnel thereby requiring additional chip space.

SUMMARY OF THE INVENTION

The present invention provides a low resistance conductor for interconnecting two points on opposite sides of an intervening conductor. The low resistance conductor comprises a first layer of doped silicon having first and second spaced edges and a second layer of doped silicon having third and fourth spaced edges, the second layer being disposed directly over the first layer. A first metal conductor is included in ohmic contact with both a portion of the first layer adjacent the first edge and a portion of the second layer adjacent the third edge. Further, a second metal conductor is included in ohmic contact with both a portion of the first layer adjacent the second edge and a portion of the second layer adjacent the fourth edge. The first and second metal conductors are on opposite sides of the intervening conductor.

BRIEF DESCRIPTION OF THE DRAWINGS

FIG. 4 is a cross-sectional view taken along the lines 4—4 of FIG. 3;

FIGS. 5, 5a, and 5b are schematic representations of portions of the prior art conductor shown in FIG. 1; and FIGS. 6, 6a, and 6b are schematic representations of portions of the low resistance conductor shown in FIGS. 2 and 3.

DESCRIPTION OF THE PREFERRED EMBODIMENT

Figure 2:
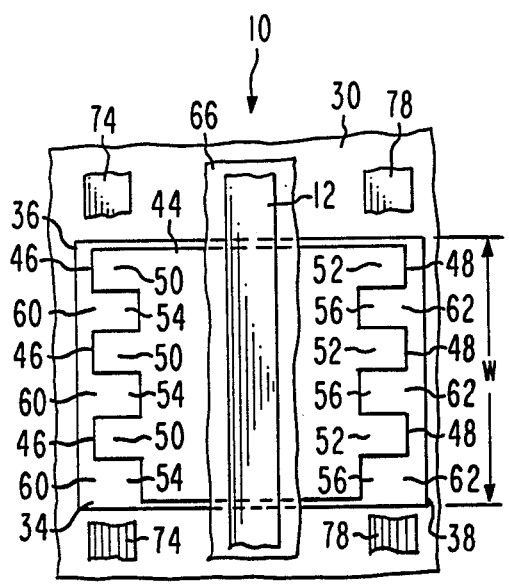
FIGS. 2 and 3 are plan views of a portion of a semiconductor device showing a low resistance conductor in accordance with the teachings of the present invention.
Figure 3:
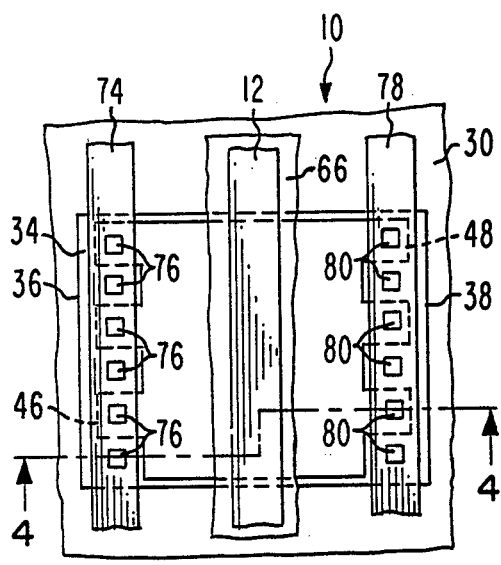

FIGS. 2, 3, and 4 show a portion of a semiconductor device 10 having a major surface 30 which, in the present example, is the surface of a layer 32 of insulating material disposed on a substrate 33 of the device 10. The surface 30, however, may be a surface of any suitable layer which is part of the semiconductor device 10, including the substrate 33.

A first layer 34 of highly doped silicon having first and second edges 36 and 38, respectively, is disposed on the surface 30. The first layer 34, having a width indicated by W in FIG. 2, may be either single crystalline or polycrystalline silicon formed by any known technique. The width W of the first layer 34 is determined by the current carrying requirement imposed on the low resistance conductor by the circuit within which it is used. A layer 40 of insulating material, such as silicon oxide, is then formed over the first layer 34 by any suitable method such as heating the first layer 34 to a temperature of about 900° C. in an oxidizing atmosphere, see FIG. 4. The layer 40 may be formed concurrently with the formation of a layer of gate oxide for MOS transistors being fabricated elsewhere on the device 10.

A second layer 44 of highly doped silicon is formed on the layer 40 directly over the first layer 34 and defined by means of standard photolithographic techniques followed by a suitable etch. The second layer 44 has a width approximately equal to W and third and fourth edges 46 and 48 which are in approximate alignment with the edges 36 and 38, respectively, of the first layer 34. FIG. 2, however, shows the width of the layer 44 to be slightly smaller than W and the third and fourth edges 46 and 48 displaced somewhat inwardly with respect to the first and second edges 36 and 38. This was done for clarity only. It will be understood by those skilled in the art that because of standard mask alignment and other tolerances related to fabrication, the vertical alignment of an edge of one layer with respect to an edge of an underlying layer may vary in any direction resulting in a lateral displacement. While, in the present example, the layers 34 and 44 are shown having the insulating layer 40 therebetween, this insulating layer 40 is not necessary to practice the teachings of the present invention. The only requirement is that the two layers 34 and 44 not be in mutual ohmic contact for a substantial portion of their respective surface areas.

When the layer 44 is defined, as set forth above, a series of openings 54 are formed through the layer 44 adjacent the third edge thereby forming the portions 50 and, similarly, a series of openings 56 are formed adjacent the fourth edge thereby forming the portions 52. While, in the present example, these openings 54 and 56 intersect with the edges 46 and 48, respectively, as shown in FIG. 2, they need not so intersect. They may simply be holes formed through the layer 44 adjacent, or relatively close to, the edges 46 and 48. In any case, the openings 54 and 56 extend through the layer 40 thereby exposing portions 60 and 62, respectively, of the underlying first layer 34, as best seen in FIG. 2.

A layer 66 of insulating material, which may be field oxide, is disposed over the layer 44 and surrounding areas of the layer 32. An intervening metal conductor 12, as described above in "Background of the Invention", is disposed on the layer 66 approximately centered and directly above the first and second layers 34 and 44, as best seen in FIG. 4. A series of openings 68 and a series of openings 70, as shown in FIG. 4, are formed through the layer 66 thereby exposing the portions 50 and 60 and the portions 52 and 62, respectively, of the second and first layers 44 and 34.

A first metal conductor 74, which in the present example is aluminum, is formed on the layer 66 so that the metal extends through the openings 68 and forms the ohmic contacts 76 with the portions 50 and 60 of the first and second layers 34 and 44, respectively, as shown in FIG. 3. The ohmic contacts 76 are somewhat smaller than the portions 50 and 60 but are of sufficient size to assure adequate current flow between the metal conductor 74 and the first and second layers 34 and 44. The contacts 76 may be of a size and shape that is similar to the contacts 20 of the prior art device shown in FIG. 1.

Similarly, a second metal conductor 78 is formed on the layer 66 so that the metal extends through the openings 70 and forms the ohmic contacts 80 with the portions 52 and 62 of the first and second layers 34 and 44, respectively, as shown in FIG. 3. The contacts 80 are similar in all respects to the contacts 76. Both the first and second metal conductors 74 and 78 are formed concurrently with the formation of first or second level metalization that interconnects various portions of the device 10.

Figure 1:
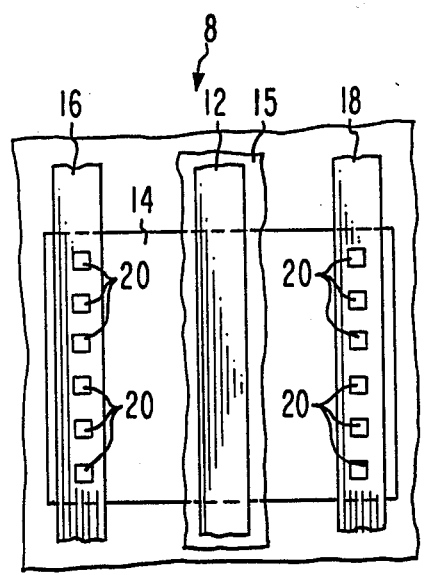
FIG. 1 is a plan view of a portion of a semiconductor device showing a prior art conductor arrangement.

In this way, a portion of the device 10 which is connected to the metal conductor 74 and lies on the left side of the intervening conductor 12, as viewed in FIG. 3, may be electrically interconnected with another portion of the device 10 which is connected to the metal conductor 78 and lies on the opposite side of the intervening conductor 12. Further, the advantage realized by utilizing the two layers 34 and 44 of conductive silicon, as opposed to the single layer 14 of the prior art device 8 shown in FIG. 1, is a reduction in resistance to about two thirds that of the single layer 14. This is the case where the physical dimensions and doping levels are substantially similar for the layers 14, 34, and 44 and where the number of contacts 78 and 80 equal the number of contacts 20.

Intuitively, it would appear from examining FIGS. 2 and 3 that by providing only half the number of contacts at each of the first and second edges of the first layer 34, that the resistance contributed by the first layer 34, as measured across the metal conductors 74 and 78, would be substantially greater than that which would result if the full number of contacts were used. Similarly, it would appear that the resistance contributed by the second layer 44 would also be greater resulting in a combined resistance for both layers that was substantially equal to the resistance of the single layer 14 of FIG. 1. That is, it appears intuitively obvious that there is no clear advantage in using two layers of conductive silicon for a conductor as taught by the present invention over using a single layer as shown in FIG. 1. It is believed that this is the reason why, in the face of a long felt need for low resistance silicon conductors, such a two layer structure was not attempted.

However, in referring to FIGS. 5, 5a, 5b, 6, 6a, and 6b, it will become obvious that there is a clear advantage inherent in the two layer structure. These figures depict a simplified structure wherein FIG. 5 shows a single layer 90 of rectangular shape having three equally spaced contacts 92 adjacent the left edge and three contacts 94 adjacent the right edge. A pair of horizontal dashed lines divide the layer 90 into three equally sized rectangles 96, 97 and 98, each of which has a contact 92 at one end and a contact 94 at the other end. A metal conductor 100 is schematically shown interconnecting the three contacts 92 and a metal conductor 102 is similarly shown interconnecting the three contacts 94. FIG. 5a is somewhat similar to FIG. 5 except that the rectangle 97 is removed thereby leaving only the rectangles 96 and 98 in their original spaced relative positions. In FIG. 5a, the metal conductors 100 and 102 interconnect the two contacts 92 and the two contacts 94, respectively. FIG. 5b depicts only the rectangle 97 of FIG. 5 with its associated contacts 92 and 94.

FIG. 6 shows a two layer structure in accordance with the teachings of the present invention having first and second layers 110 and 112 of conductive silicon. Three contacts 114 are equally spaced adjacent the left edge and three contacts 116 are similarly spaced adjacent the right edge. A metal conductor 118 is schematically shown interconnecting the three contacts 114 and a metal conductor 120 is similarly shown interconnecting the three contacts 116. FIG. 6a shows only the layer 110 of FIG. 6 and FIG. 6b shows only the layer 112 of FIG. 6. A pair of horizontal dashed lines divide the layer 110 into three rectangles 122, 124, and 126 which are similar in size to the rectangles 96, 97, and 98.

It will be understood that the resistance measured across the conductors 100 and 102 of the layer 90 as shown in FIG. 5 will be substantially the same as the combined resistances, or parallel resistance, of the pair of rectangles 96, 98 shown in FIG. 5a and the single rectangle 97 shown in FIG. 5b when interconnected in parallel. Similarly, it will be understood that the resistance measured across the conductors 118 and 120 of the combined layers 110, 112 as shown in FIG. 6 will be substantially the same as the combined resistances of the separate layers 110 shown in FIG. 6a and 112 shown in FIG. 6b when interconnected in parallel.

Referring now to FIGS. 5a and 6a, should the rectangle 124 be removed from the layer 110, then the resulting layer would be identical to the pair of rectangles 96, 98 and would yield the same parallel resistance. This would be true because the rectangles 122 and 126 of FIG. 6a are identical in all respects to the rectangles 96 and 98 of FIG. 5a. However, since the layer 110 includes the rectangle 124 which is formed as a physical part of the layer 110 and is electrically in parallel with the rectangles 122 and 126, the resistance of the layer 110 will be less than it would be if the rectangle 124 were missing. Therefore, the resistance of the layer 110 is shown in FIG. 6a and measured across the conductors 118 and 120 will be less than the resistance of the pair of rectangles 96 and 98 shown in FIG. 5a and measured across the conductors 100 and 102.

Referring now to FIGS. 5b and 6b, a similar conclusion can be reached with respect to the resistance of the layer 112 with respect to the rectangle 97. The layer 112 has a central rectangular portion 128, defined by dashed lines, which is identical in size to the rectangle 97 of FIG. 5b. However, the layer 112 also includes the portions 130 and 132 on each side of the rectangle 128 which are a physical part thereof and electrically in parallel therewith. The resistance of the portions 130 and 132 reduces the overall resistance of the layer 112 as measured across the contacts 114 and 116. Therefore, the resistance of the layer 112 shown in FIG. 6b will be less than the resistance of the rectangle 97 shown in FIG. 5b. This, of course, results in the resistance of the combined layers 110, 112 shown in FIG. 6 and measured across the conductors 118 and 120 being less than the resistance of the layer 90 shown in FIG. 5 and measured across the conductors 100 and 102.

The above discussion, while not providing a quantitative examination of the differences between the single and double layer structures, does provide an intuitive understanding of the result that the two layer conductor of the present invention is of lower resistance than is the single layer conductor of the prior art. In actual practice, the resistance of the two layer structure is found to be approximately two thirds that of a comparable single layer structure.

I claim:

1. A low resistance conductor for interconnecting two points on opposite sides of an intervening conductor comprising:
   (a) a first layer of doped silicon having a first edge and a second edge spaced from said first edge;
   (b) a second layer of doped silicon having a third edge and a fourth edge spaced from said third edge, said second layer being disposed directly over said first layer;
   (c) a first metal conductor in ohmic contact with said first layer adjacent said first edge and said second layer adjacent said third edge; and
   (d) a second metal conductor in ohmic contact with said first layer adjacent said second edge and said second layer adjacent said fourth edge, said first and second metal conductors being disposed on opposite sides of said intervening conductor wherein said second layer includes, along said third edge and along said fourth edge, (1) a plurality of openings through which said first and second metal conductors extend to be in said ohmic contact with, respectively, said first and second edges of said first layer, and (2) an area of contact to the adjacent metal conductor, each area being disposed between each pair of said openings.

2. The conductor set forth in claim 1 wherein said plurality of openings in said second layer are substantially equally spaced along their respective third and fourth edges.

3. The conductor set forth in claim 1 wherein each of said plurality of contact areas are of substantially the same size.

4. The conductor set fourth in claim 3 wherein each of said plurality of contact areas and each of said plurality of openings are of substantially the same size.

5. The conductor set fourth in claim 4 wherein at least one of said plurality of openings extends to its adjacent third or fourth edge.

6. The conductor set forth in claim 5 wherein at least one of said plurality of openings extends to its adjacent third or fourth edge.

* * * * *